United States Patent  
Christensen et al.

(10) Patent No.: US 8,861,747 B2
(45) Date of Patent: Oct. 14, 2014

(54) SELF POWERED AUDIO COMPRESSOR CIRCUIT

(75) Inventors: Ole N. Christensen, Solrød Strand (DK); Niels C. S. Hansen, Solrød Strand (DK)

(73) Assignee: Senheiser Communications A/S, Solrod Strand (DK)

( * ) Notice: Subject to any disclaimer, the term of this patent is extended or adjusted under 35 U.S.C. 154(b) by 567 days.

(21) Appl. No.: 13/166,995

(22) Filed: Jun. 23, 2011

(65) Prior Publication Data

US 2011/0317857 A1 Dec. 29, 2011

Related U.S. Application Data

(60) Provisional application No. 61/358,426, filed on Jun. 25, 2010.

(30) Foreign Application Priority Data

Jun. 25, 2010 (EP) .................................... 10167266

(51) Int. Cl.
| | | |
|---|---|---|
| H03G 7/00 | (2006.01) |
| A61F 11/06 | (2006.01) |
| H04R 1/10 | (2006.01) |
| H04B 15/00 | (2006.01) |
| H04R 5/02 | (2006.01) |
| H04B 1/64 | (2006.01) |
| H03G 11/04 | (2006.01) |

(52) U.S. Cl.
CPC ................. *H03G 7/004* (2013.01); *H04B 1/64* (2013.01); *H03G 11/04* (2013.01)
USPC .............. 381/106; 381/72; 381/74; 381/94.8; 381/309

(58) Field of Classification Search
CPC ........ H03G 7/002; H03G 7/004; H03G 7/005
USPC ..................... 381/309, 94.8, 94.5, 74, 72, 106
See application file for complete search history.

(56) References Cited

FOREIGN PATENT DOCUMENTS

| | | |
|---|---|---|
| GB | 2 120 903 A | 12/1983 |
| GB | 2 166 015 A | 4/1986 |
| WO | WO 03/079722 A1 | 9/2003 |
| WO | WO 2008/013488 A1 | 1/2008 |

OTHER PUBLICATIONS

Industry Guideline, ACIF G616:2006, "Acoustic Safety for Telephone Equipment", Published by the Australian Communications Industry Forum, 2nd edition 2006, (www.acif.org.au).

*Primary Examiner* — Vivian Chin
*Assistant Examiner* — Douglas Suthers
(74) *Attorney, Agent, or Firm* — Birch, Stewart, Kolasch & Birch, LLP (57) ABSTRACT

The application relates to a compressor circuit for a listening device, the compressor circuit comprising a pair of input terminals and a pair of output terminals, the compressor circuit being adapted for receiving an electric input signal representing an audio signal with an input voltage swing $V_{ipp}$ at the input terminals and for providing a possibly compressed version of the input signal as an output signal with an output voltage swing $V_{opp}$ at the output terminals, the compressor circuit comprising. The application further relates to a listening device and to the use of the compressor circuit. The object of the present application is to provide a compressor circuit with a proper functioning also at relatively low input levels. The problem is solved in that an AC to DC voltage converter for generating a DC-control voltage based on the electric input signal or an AC signal derived therefrom, and a voltage controlled resistance for providing an output voltage swing $V_{opp}$ controlled by the DC-control voltage, wherein the compressor circuit is energized by the electric input signal. An advantage thereof is that a compressor circuit facilitating a flexible adjustment of the maximum output level is provided. The invention may e.g. be used in portable and non-powered listening devices, e.g. headsets or active ear protection devices.

20 Claims, 8 Drawing Sheets

SELF POWERED AUDIO COMPRESSOR CIRCUIT

This nonprovisional application claims the benefit of U.S. Provisional Application No. 61/358,426 filed on Jun. 25, 2010 and to Patent Application No. 10167266.5 filed in Europe on Jun. 25, 2010. The entire contents of all of the above applications is hereby incorporated by reference into the present application.

TECHNICAL FIELD

The present application relates to an audio compressor circuit for limiting audio volume in a communication device, in particular to a compressor circuit that does not require a separate power supply. The application furthermore relates to the use of a compressor circuit and to a listening device and a stereo headset.

The disclosure may e.g. be useful in applications such as portable and non-powered listening devices, e.g. headsets or active ear protection devices.

BACKGROUND ART

Acoustic noise in large amounts can be unfavourable to human well being and ultimately to health. In some countries, government regulations exist attempting to protect employees by setting various maximum allowable dose levels and peak levels during a working day or week. Such levels relate e.g. to the levels of noise exposure averaged over a working day or week, and to the maximum noise (peak sound pressure) to which employees are exposed over a working day. In the EU, such levels are set in the "DIRECTIVE 2003/10/EC OF THE EUROPEAN PARLIAMENT AND OF THE COUNCIL of 6 Feb. 2003 on the minimum health and safety requirements regarding the exposure of workers to the risks arising from physical agents (noise)".

In the EU-directive, the daily exposure limit value $L_{EX,8h}$ defines that the exposure in dB(A) (minus the attenuation from any hearing protectors) have to be lower than 87 dB(A) during a normal 8 hour working day. The daily exposure level $L_{EX,8h}$ is a time weighted average of the instantaneous noise pressure level (relative to 20 μPa) for a nominal eight hour working day (cf. e.g. ISO 1999:1990, *Acoustics—Determination of occupational noise exposure and estimation of noise-induced hearing impairment*). The unit 'dBA' or 'dB(A)' refers to a weighting of the signal to approximate the different sensitivity of the human auditory system at different frequencies, the 'A-weighting' (roughly) applying a lower weight to sounds below 1 kHz and above 4 kHz, see e.g. International standard IEC 61672:2003. Further, it is defined that the peak sound pressure $p_{peak}$ at any time during the day has to be below 200 Pa, corresponding to 140 dB(C) in relation to 20 μPa. The unit 'dBC' or 'dB(C)' refers to a weighting of the signal similar to the 'A-weighting', but with a lower cut-off frequency at low frequencies (around 50 Hz instead of around 1 kHz).

A compressor circuit designed to improve a telephone system in a manner that improves the ability of the system to resist the transmission of a shock arising in the telephone system to the headset user is e.g. described in WO 03/079722 A1. In an embodiment, the circuit is adapted to immediately reduce the output signal when the input signal reaches a certain (high) level (e.g. above 105 dB).

DISCLOSURE OF INVENTION

An object of the present application is to provide a compressor circuit with a proper functioning also at relatively low input levels.

The terms 'compressor' or 'signal compression' are in the present text taken to refer to their general meaning in the field of telecommunication, and more specifically to a circuit for or the process of attenuating an analogue, time varying input signal dependent on its level (e.g. peak to peak). The terms are e.g. not intended to refer to circuits or processes for data compression (audio coding/decoding).

Objects of the application are achieved by the invention described in the accompanying claims and as described in the following.

A Compressor Circuit:

An object of the application is achieved by a compressor circuit for a listening device, the compressor circuit comprising a pair of input terminals and a pair of output terminals, the compressor circuit being adapted for receiving an electric input signal representing an audio signal with an input voltage swing $V_{ipp}$ at the input terminals and for providing a possibly compressed version of the input signal as an output signal with an output voltage swing $V_{opp}$ at the output terminals, the compressor circuit comprising an AC to DC voltage converter for generating a DC-control voltage based on the electric input signal or an AC signal derived therefrom, and a voltage controlled resistance for providing an output voltage swing $V_{opp}$ controlled by the DC-control voltage, wherein the compressor circuit is energized by the electric input signal.

An advantage thereof is that a compressor circuit facilitating a flexible adjustment of the maximum output level is provided.

In many applications the circuit (e.g. an amplifier), which the compressor circuit is intended to be connected to, has an impedance that is appropriate for providing sufficient input resistance. In applications where such performance cannot be predicted, a drop resistance is preferably included. In an embodiment, the compressor circuit comprises a drop resistance for providing a minimum input resistance of the compressor circuit.

In an embodiment, the compressor circuit comprises an AC voltage control unit for controlling the AC voltage (e.g. providing an increased AC voltage). The AC voltage control unit is preferably connected to input terminals of the compressor circuit or to a second terminal of a drop resistance. Preferably, the AC to DC voltage converter generates the DC-control voltage based on an increased AC voltage from the AC voltage control unit.

Embodiments of the compressor circuit have one or more of the following features:

1: The circuit is a functionally active electronic AGC-compressor circuit, which requires no specific energy source and thus energetically can be considered as a passive unit. The circuit is thus suitable for use as an active protection and limiting circuit in non powered portable devices such as add-on headsets or headphones.

2: The compressor circuit comprises a voltage controlled resistance (e.g. based on two anti-serially coupled (MOS-) FET transistors). By providing a large dynamic range of the swing through an electrical feedback system, a low distortion can be obtained.

3: The control circuit preferably comprises a voltage multiplication unit (e.g. a step-up audio transformer) and a corresponding rectifying circuit. By appropriately choosing the voltage multiplication factor, the compressor circuit can be tuned to a predefined maximum output voltage level.

In an embodiment, the drop resistance comprises a resistor. In a particular embodiment, the drop (or fall) resistance comprises a PTC resistor. This has the advantage that the output voltage of the compressor circuit will be reduced (compared to the situation of a normal drop-resistor) because the temperature increase of the PTC resistor due to the dissipated power results in an increase in drop-resistance and hence a decreased output voltage. To reduce the impedance of the compressor circuit the resistor can, however, be omitted.

In an embodiment, the drop resistance comprises first and second electric terminals, and the first terminal is connected to one of the input terminals of the compressor circuit. In an embodiment, the second terminal is connected to an input of an AC voltage control circuit or to an input of the AC to DC voltage converter.

In a particular embodiment, the AC voltage control unit provides a predefined multiplication factor M, so that the output voltage from the multiplication unit is a factor M times the input voltage to the multiplication unit. In a particular embodiment, the compressor circuit is adapted to provide that the multiplication factor M can be set between a maximum and a minimum value, e.g. in predefined steps. This has the advantage of providing a possibility of setting the maximum output voltage level to a predefined level, thereby e.g. influencing the daily exposure. In an embodiment, the multiplication factor is adapted to provide that the maximum output level is set to a level equal to a target average level of exposure $L_{EX,T}$, e.g. 87 dB(A) (T being a time over which sound pressure level is averaged, e.g. 8 hours or one week or any other appropriate time span). In an embodiment, the multiplication factor is adapted to provide that the maximum output level is set to a level equal to a target average level of exposure $L_{EX,T}$ plus a signal dependent x-margin ΔLx. In an embodiment, the x-margin ΔLx is 3 dB, or 5 dB, or 7 dB, or 9 dB, or 11 dB or larger. If the intended use of the circuit is in an environment dominated by speech, e.g. in a call centre or in a stock exchange environment, the x-margin is relatively large, e.g. larger than 7 dB. The choice of x-margin ΔLx is e.g. language dependent. If the intended use of the circuit is in an environment dominated by industrial noise, e.g. machine noise, e.g. in noisy production environment, the x-margin is relatively small, e.g. smaller than 5 dB.

In an embodiment, the maximum output level is adapted to be settable by a user, e.g. via a user interface for the device in question, e.g. a headset. In an embodiment, the maximum output level is adapted to be settable using a special tool. This can e.g. be of value, if parents want to limit the amount of sound exposure from a headset or a headphone used by a child, e.g. in connection with sound from an entertainment device, e.g. a music player or a PC or a game console, e.g. providing music or game-sounds as electric input signals to the compressor circuit.

In an embodiment, the maximum output level is adapted to be controlled depending on a measure or an estimate of an accumulated acoustic dose. When the measured or estimated dose ($L_{AT}$ or $L_{eq}$, equivalent continuous sound level, cf. e.g. paragraph 3.9 Definitions of IEC 61672-1) is above a given threshold (relative to a predefined time period), the maximum output level may be decreased according to a predefined scheme.

In a particular embodiment, the AC voltage control unit comprises a transformer, e.g. an audio transformer. Thereby the multiplication factor can be controlled by the relative number of turns of the primary and secondary coils of the transformer. In an embodiment, the secondary coil has a number of outputs each corresponding to a different number of turns, thereby implementing different multiplication factors M. In a particular embodiment, the AC multiplication unit comprises a diode circuit. In a particular embodiment, the AC multiplication unit comprises a circuit comprising a piezoelectric element.

In an embodiment, the AC voltage control unit comprises first and second input terminals and first and second output terminals. In an embodiment, the first and second input terminals are connected to the first and second input terminals of the compressor circuit (possibly after a drop resistance connected to one of the input terminals of the compressor circuit).

In a particular embodiment, the AC to DC voltage converter comprises a diode circuit. In a particular embodiment, the AC to DC voltage converter comprises a capacitor.

In a particular embodiment, the voltage controlled resistance is adapted to be operable on the power provided by the input signal to the compressor circuit. In a particular embodiment, the voltage controlled resistance comprises a transistor. In a particular embodiment, the voltage controlled resistance comprises a FET transistor. This has the advantage of providing a simple voltage control. Alternatively, a bipolar transistor can be used.

In a particular embodiment, the voltage controlled resistance comprises two FET transistors whose source terminals are electrically connected ("reverse coupled").

In a particular embodiment, the gate terminals of the two FET transistors are AC coupled to their respective drain terminals (e.g. by inserting a capacitor between the gate and drain terminals of the two FET transistors). This has the advantage of adding a feedback circuit and by that, reducing distortion.

In some applications it is important that the degree of compression varies with frequency. This can be an advantage because the human ear is more sensible for certain frequencies. Also such feature can be beneficial when unwanted specific signals of known frequency shall be reduced (e.g. in a specific frequency range). Hence, In an embodiment, the compressor circuit is adapted to provide that the output voltage from the compressor circuit is varying with the audio frequency in a predetermined manner. Preferably, signal components of the output signal in a predefined frequency range are attenuated, e.g. frequencies above a predefined threshold frequency.

This can be done by adding frequency dependent components (e.g. comprising one or more capacitors and/or inductors) in the signal path to the sense/control circuit of the compressor circuit (i.e. in 'the control path' comprising the circuitry for generating a DC-control voltage based on the electric input signal for controlling the voltage controlled resistance).

Such functionality is e.g. described in [ACIF G616:2006].

A Listening Device Comprising a Compressor Circuit:

A listening device comprising a compressor circuit as described above, in the detailed description of 'mode(s) for carrying out the invention' and in the claims is furthermore provided, wherein a speaker unit is electrically connected to the compressor circuit. In an embodiment, the listening device is adapted to limit the output of the speaker unit to a predefined maximum sound pressure level. A listening device can e.g. comprise a headset, an active ear protection device, a hearing instrument, an ear phone, a head phone or any combination thereof, or any device that provides an output which is intended to be perceived as a sound by the user. In an embodiment, the listening device comprises a dose unit for measuring or estimating an accumulated acoustic dose experienced by the listening device over a given time period (e.g. as measured or estimated at the eardrum or a user wearing the listening device).

A Stereo Headset:

A stereo headset comprising first and second listening devices as described above, in the detailed description of 'mode(s) for carrying out the invention' and in the claims is furthermore provided. In an embodiment, each listening device comprises an earphone (speaker) connected to the compressor circuit of the listening device. The stereo headset is adapted to receive separate audio signals (e.g. from an audio delivery device) to said first and second listening devices. In an embodiment, the stereo headset comprises circuitry adapted to provide that the output levels in the respective earphones controlled by the respective compressor circuits of the first and second listening devices are correlated, so that a specific compression in one of the earphones results in a corresponding compression at the other earphone (so that a possible absolute or relative level difference between the to earphones is maintained). Preferably, the earphone presently experiencing the highest level determines the output level of both earphones (respecting their absolute or relative level differences). In an embodiment, the system is adapted to limit the output (of any of the speakers of the system) to a predefined maximum sound pressure level.

Use of a Compressor Circuit:

Use of a compressor circuit as described above, in the detailed description of 'mode(s) for carrying out the invention' and in the claims is furthermore provided by the present application. In an embodiment, use is e.g. provided in a listening device, e.g. a headset, a hearing instrument, a headphone or a protective ear plug or combinations thereof. Further use may be provided in connection with an electric input signal representing an audio signal from a telephone or a PC. Also, use wherein the output terminals of the compressor circuit are connected to an output transducer, e.g. a speaker, is provided. Further, use may be provided in connection with an electric input signal representing an audio signal from an audio delivery device, such as a an entertainment device, e.g. a video display unit or a music player or a radio or TV set or a game console or a karaoke system or a public address (PA) system or a music amplification system.

Further objects of the application are achieved by the embodiments defined in the dependent claims and in the detailed description of the invention.

As used herein, the singular forms "a," "an," and "the" are intended to include the plural forms as well (i.e. to have the meaning "at least one"), unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements maybe present, unless expressly stated otherwise. Furthermore, "connected" or "coupled" as used herein may include wirelessly connected or coupled. As used herein, the term "and/or" includes any and all combinations of one or more of the associated listed items. The steps of any method disclosed herein do not have to be performed in the exact order disclosed, unless expressly stated otherwise.

BRIEF DESCRIPTION OF DRAWINGS

The disclosure will be explained more fully below in connection with a preferred embodiment and with reference to the drawings in which:

FIG. 4 shows two embodiments of a listening device comprising a compressor circuit according to the present application, FIG. 4a representing e.g. a wired ear phone application and FIG. 4b e.g. a wireless headset application, FIG. 5 shows three embodiments of a communication system comprising a compressor circuit according to the present application, FIG. 5a showing a system comprising a telephone and a listening device connected via a wired interface, FIG. 5b showing a system comprising a PC or other computer device and a listening device connected via a wired interface, and FIG. 5c showing a system comprising a cellular telephone and a listening device connected via a wireless interface.

The figures are schematic and simplified for clarity, and they just show details which are essential to the understanding of the disclosure, while other details are left out. Throughout, the same reference numerals or names are used for identical or corresponding parts.

Further scope of applicability of the present disclosure will become apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

MODE(S) FOR CARRYING OUT THE INVENTION

An aim of the compressor circuit CC, when used in a listening device, such as a headset or an active ear protection device, is to limit the sound level pressure generated by a speaker of the listening device, e.g. so that the exposure of the user to acoustic noise is limited, e.g. to comply with government regulations, e.g. to limit the (average) exposure to a maximum of 85 dBA per working day.

The compressor circuit CC is an electronic circuit that is e.g. inserted between an audio delivery device (ADD in FIGS. 1 and 2), e.g. a telephone, and a (loud)speaker (SPEAKER in FIGS. 1 and 2) of a listening device (e.g. a headset). The embodiments of compressor circuit CC shown in FIGS. 1 and 2 may, together with the SPEAKER and possibly including the audio delivery device ADD, form part of or constitute a listening device. The compressor circuit CC comprises a pair of input terminals $I_1$, $I_2$ and a pair of output terminals, $O_1$, $O_2$. The compressor circuit is adapted for receiving an electric input signal $V_{IN}$ (here from an audio delivery device, e.g. a telephone) representing an audio signal with an (time dependent) input voltage swing $V_{ipp}$ at the input terminals $I_1$, $I_2$, and for providing a (time and input level dependent) possibly compressed version of the input signal as an output signal $V_{OUT}$ with an output voltage swing $V_{opp}$ at the output terminals $O_1$, $O_2$.

Figure 1:
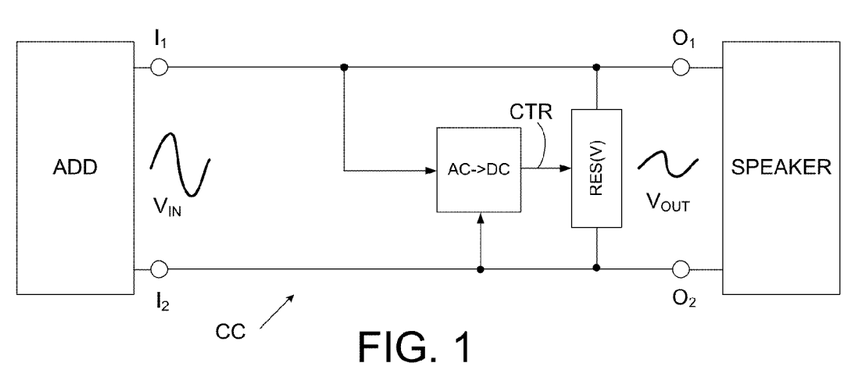
FIG. 1 shows a first basic embodiment of a compressor circuit according to the present application.

FIG. 1 shows a first basic embodiment of a compressor circuit CC according to the present application. The embodiment shown in FIG. 1 comprises an AC to DC voltage converter AC→DC for generating a DC-control voltage signal CTR based on a time variant input signal (here $V_{IN}$ ($I_1$, $I_2$)), and a voltage controlled resistance RES(V) for providing the output voltage $V_{OUT}$ having a voltage swing of $V_{opp}$ controlled by the DC-control voltage CTR.

FIG. 2 shows second to sixth embodiments of a compressor circuit according to the present application. The embodiments of a compressor circuit CC shown in FIG. 2*a*-2*e* comprises the same components as the most general embodiment shown in FIG. 1. The compressor circuits CC of FIG. 2 further comprise a drop resistance D-RES for providing a minimum input resistance of the compressor circuit, an AC voltage control unit XV for providing an increased AC voltage MV providing an input to the AC to DC voltage converter AC→DC for generating a DC-control voltage signal CTR based on the increased AC voltage, which is used to control the voltage controlled resistance RES(V) for providing the output voltage $V_{OUT}$.

Figure 2A:
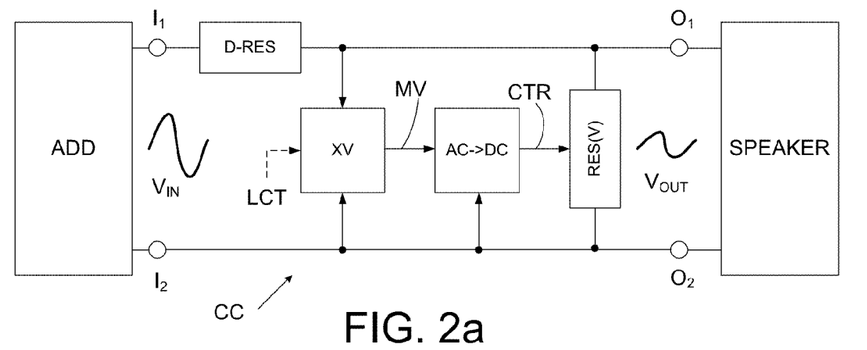
FIG. 2 shows second to sixth embodiments of a compressor circuit according to the present application.

In the embodiment of FIG. 2*a*, first and second terminals of the drop resistance D-RES are connected to the first input terminal $I_1$ and the first output terminal $O_1$ of the compressor circuit CC, respectively. First and second input terminals of the AC voltage control unit XV are connected to the second terminal of the drop resistance and to the second input terminal $I_2$ of the compressor circuit CC, respectively. In case that no drop resistance is present, the terminals of the AC voltage control unit XV are e.g. connected to the input terminals $I_1$ and $I_2$ of the compressor circuit CC. The multiplication factor of the AC voltage control unit XV may be fixed or e.g. be controlled by optional control input LTC. The control input LTC may be based on a user input or on an input from a dose unit (DU) for measuring or estimating an acoustic dose accumulated over a predefined period of time. Output signal MV of the AC voltage control unit XV is connected to corresponding input terminal of the AC to DC voltage converter AC→DC. The voltage controlled resistance RES(V) is connected in parallel over the output terminals $O_1$ and $O_2$ of the compressor circuit CC. A DC control voltage output CTR of the AC to DC voltage converter AC→DC is connected to a voltage control input of the voltage controlled resistance RES (V). The input terminals $I_1$ and $I_2$ of the compressor circuit CC are connected to the audio output terminals of an audio delivery device ADD, e.g. a communication or entertainment device, e.g. the (electric) speaker output of a telephone or a PC or a music player. The output terminals $O_1$ and $O_2$ of the compressor circuit CC are suitable for being connected to input terminals of a speaker unit SPEAKER, e.g. of a listening device, e.g. a headset.

The compressor circuit CC behaves energetically as a passive circuit in that it does not require any power supply, whereas functionally it behaves like an active circuit providing compression with a well defined maximum output voltage and well defined attack- and release-times. The attack and release times are set in the AC→DC converter, by setting the charge and discharge time of different capacitors. Preferably, the attack time is smaller than the release time. In an embodiment, the attack time is 3 to 8 times smaller than the release time. In an embodiment, the attack time is in the range from 20 ms to 50 ms.

Figure 2B:
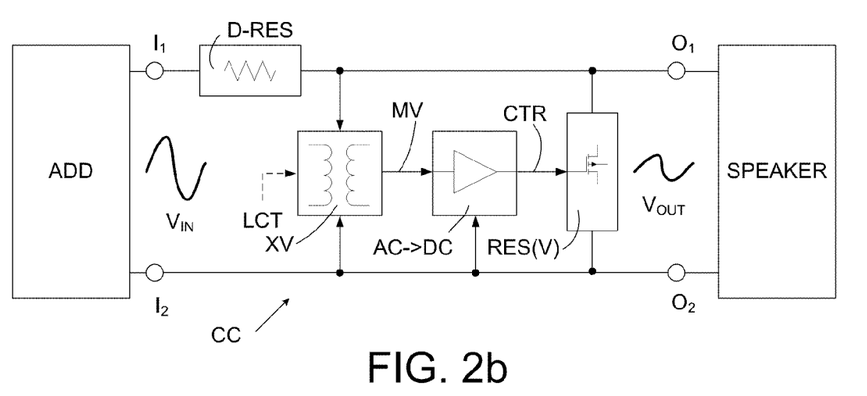

The embodiment of a processor circuit CC of FIG. 2*b* comprises the same functional elements as the embodiment of FIG. 2*a*. In the embodiment of FIG. 2*b*, the drop resistance D-RES is indicated to comprise a resistor, e.g. in the range from $10\Omega$ to $100\Omega$ depending on the system connected to the compressor circuit and the specification of the RES(V), e.g. a resistor having a positive temperature coefficient (so that its resistance increases with increasing temperature of the resistor; e.g. with increasing current through the resistor). The AC voltage control unit XV is indicated to comprise a transformer, whereby the multiplication factor M can be controlled by the relative number of turns of the primary and secondary coils of the transformer. In an embodiment, the secondary coil has a number of outputs each corresponding to a different number of turns, thereby implementing different multiplication factors M. In an embodiment, the actually used output (and thus the multiplication factor M) is controlled by the level control input LCT. The AC to DC voltage converter AC→DC comprises a rectifying circuit, e.g. a diode circuit, e.g. a diode bridge circuit. The rectifying circuit may e.g. comprise capacitor and/or resistor circuitry for controlling the attack and release time. The voltage controlled resistance RES(V) comprises a transistor, e.g. a FET transistor, wherein the resistance of the unit is controlled by DC voltage CTR applied to the gate or base terminal of the transistor. In addition to the transistor(s), the voltage controlled resistance RES (V) may comprise various other components (such as capacitors, diodes and/or resistors) for determining the resistance, attack and release times.

Figure 2C:
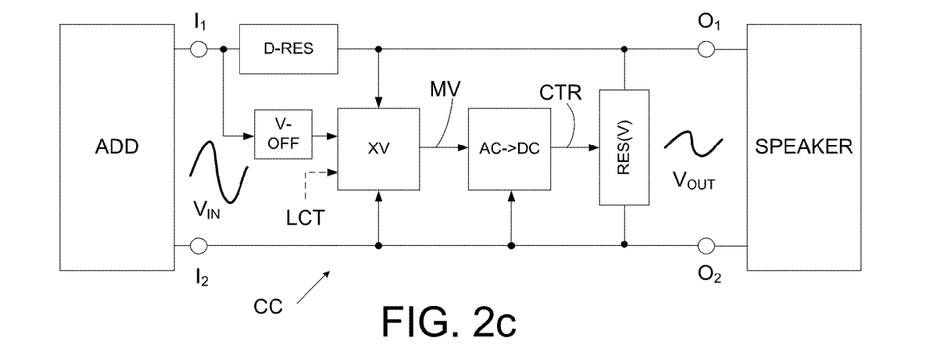
Figure 2D:
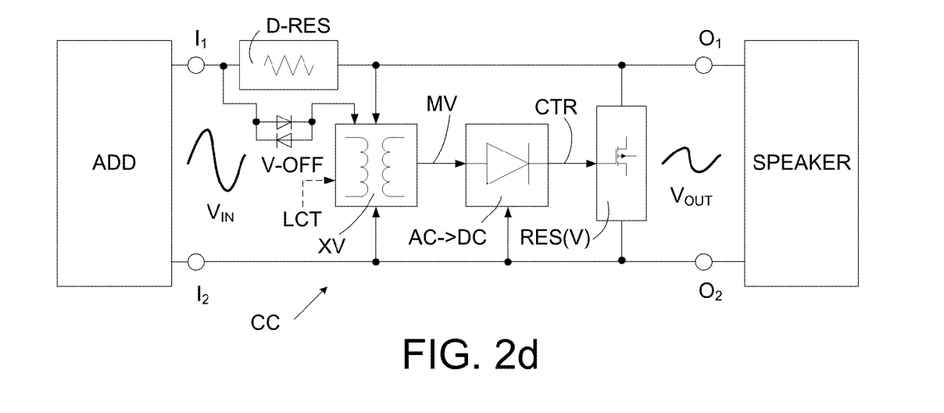
Figure 2E:
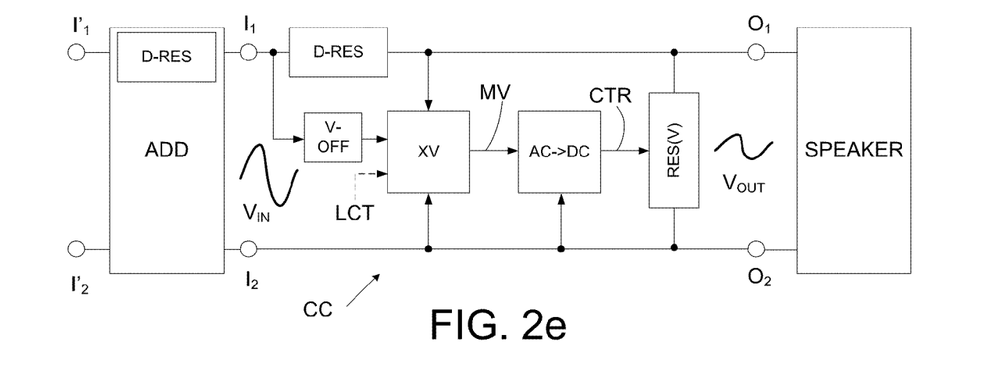
Figure 8:
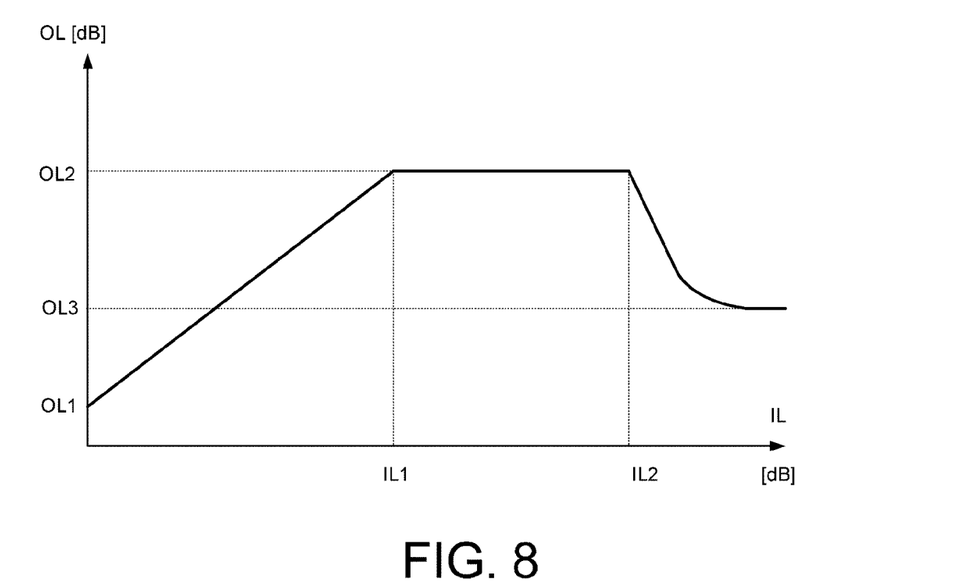
FIG. 8 shows an example of a compression curve defining output level as a function of input level for a compressor circuit according to an embodiment of the present application.

The general purpose of a compressor circuit is to compress (attenuate) an output level compared to an input level, typically with an increased compression ratio at higher input levels. In typical standard applications in connection with listening devices, the purpose of the compressor circuit is to reflect (mirror) the input level at the output of circuit for input levels below a predefined input threshold level IL1 (e.g. where output level OL=input level IL, or alternatively where OL=k·IL and 0<k<1, for IL<IL1) and to attenuate (compress) the output level relative to the input level for input levels above such predefined threshold level IL1. The shape of the output level vs. input level of the compressor circuit above this input threshold level IL1 may take on many forms, be it linear, non-linear, constant, increasing (slower than the input level) or even decreasing with increasing input level (cf. e.g. FIG. 3 in WO 03/079722 A1). The embodiments of a compressor circuit shown in FIG. 2*c*-2*e* represent circuit examples providing an output level versus input level relationship comprising a lower, linear part where OL=IL for input levels below a first input level IL1, an intermediate part between the first input level IL1 and a second input level IL2 where the output level increases slower than the input level or is substantially constant, and an upper part above the second input level IL2, where the output level decreases compared to the output level OL2 reached at the input level IL2. Such (exemplary) relationship is schematically shown in FIG. 8. In FIG. 8, the middle part of the curve represents a situation where the compressor circuit is adapted to provide that the output level is constant and limited to a predefined maximum output level OL2 when the input level is larger than a first input level IL1. IL1 and OL2 may e.g. be adapted to provide that a specific estimated daily exposure $L_{EX,8h}$ is not (expected to be) exceeded (taking the expected environment of use into consideration). Such levels may be set using the level control input LCT. Above the second input level IL2, the output level is actively decreased to protect the wearer against erroneous very high level input signals (e.g. howl). Such feature is particularly useful (necessary) when the compressor circuit is used in connection with fixed line telephones, where such erroneous high level signals may occasionally prevail.

The embodiment of a compressor circuit shown in FIG. 2c comprises the same elements as the embodiment shown in FIG. 2a. Additionally, the compressor circuit CC of FIG. 2c comprises a Voltage offset unit V-OFF for generating a (possibly variable) offset voltage. The offset voltage VOFF generated by the Voltage offset unit V-OFF is subtracted from the input voltage I1, and the resultant voltage is added to the output voltage O1 in the AC voltage control unit XV, whereby the decrease in output level for increasing input levels above the second input level IL2 is implemented (cf. FIG. 8). In the embodiment of a compressor circuit shown in FIG. 2d the Voltage offset unit V-OFF of FIG. 2c is implemented as a pair of diodes in an anti-parallel coupling. More than one pair of diodes may be serially coupled to vary the possible offset voltages generated by the Voltage offset unit V-OFF, the larger the offset, the larger the intermediate part of the compression curve in FIG. 8. A pair of Schottky diodes provides an offset of approximately 150 mVolt, whereas a pair of ordinary pn-junction diodes provides an offset of approximately 500 mVolt, two serially coupled pairs thus providing an offset voltage of 1 Volt. In an embodiment, the Voltage offset unit V-OFF is configurable to allow a user (or a technician) to set the offset voltage VOFF (e.g. in predetermined steps, e.g. by having a series of coupled diode pairs with individually selectable separate outputs from each pair).

In FIG. 2e a further drop resistance D-RES is inserted in the input path of the audio delivery device ADD to be serially coupled with the drop resistance D-RES of the compressor circuit (the additional drop resistance is shown to form part of the audio delivery device, but may, alternatively or additionally, form part of the compressor circuit). Thereby, the attenuation (OL2–OL3) of the third part of the compression curve for input levels above IL2 in FIG. 8 can be controlled.

Exemplary values of the input and output levels determining the compression curve of FIG. 8 are: The maximum output level (OL2 in FIG. 8) is e.g. limited to 80-90 dBA, e.g. 85 dBA. The step decrease (OL2–OL3 in FIG. 8) below the maximum output level for very large input levels is e.g. adapted to be larger than 10 dB, e.g. larger than 15 dB, e.g. around 20 dB.

The control of the output signal $V_{OUT}$ of the compressor circuit CC is explained in the following with reference to FIGS. 2 and 8.

In low level part of the input signal up to "IL1", the activation level of the compressor circuit has not been reached and the output signal follows the input signal. In the intermediate part where the input level is between "IL1" and "IL2" the output signal has reached a level where limitation is needed. The degree of limitation is controlled by the AC voltage control unit XV, which monitors the output signal O1, and modifies the output signal to a constant level (because when the output signal increases, the input to the XV-unit increases with a resulting decrease in regulation to provide that the output signal is kept constant).

In the high level part above "IL2" the input signal has a level that is so high that the input signal is interpreted as an error signal, for which reason an increased attenuation of the output signal is needed. This is provided when the level of the input signal increases more than an offset voltage VOFF of the Voltage offset unit "V-OFF" (e.g. one or more diode voltage drops) above the output voltage O1, and the input signal minus I1 the offset voltage VOFF are added in the AC voltage control unit XV to the O1 signal, so that the control circuit is dominated by the input signal, and the output signal will be decreased with increasing input voltage.

In summary, in the low level part up to an input level "IL1" the circuit is not active and provides no compression. In the intermediate part between input levels "IL1" and "IL2" the compressor circuit monitors the output of the circuit and holds the output level constant. In the high level part above "IL2" the compressor circuit monitors the input signal (because the input signal signalet now is V-OFF higher than the output signal) and hence the output signal is decreased as the input signal increases. The actual levels of IL1, IL2 and correspondingly OL1, OL2, OL3 (and actual shape of the OL(IL) curve between these values) can be adapted to the application in question by properly adjusting component values.

Figure 3:
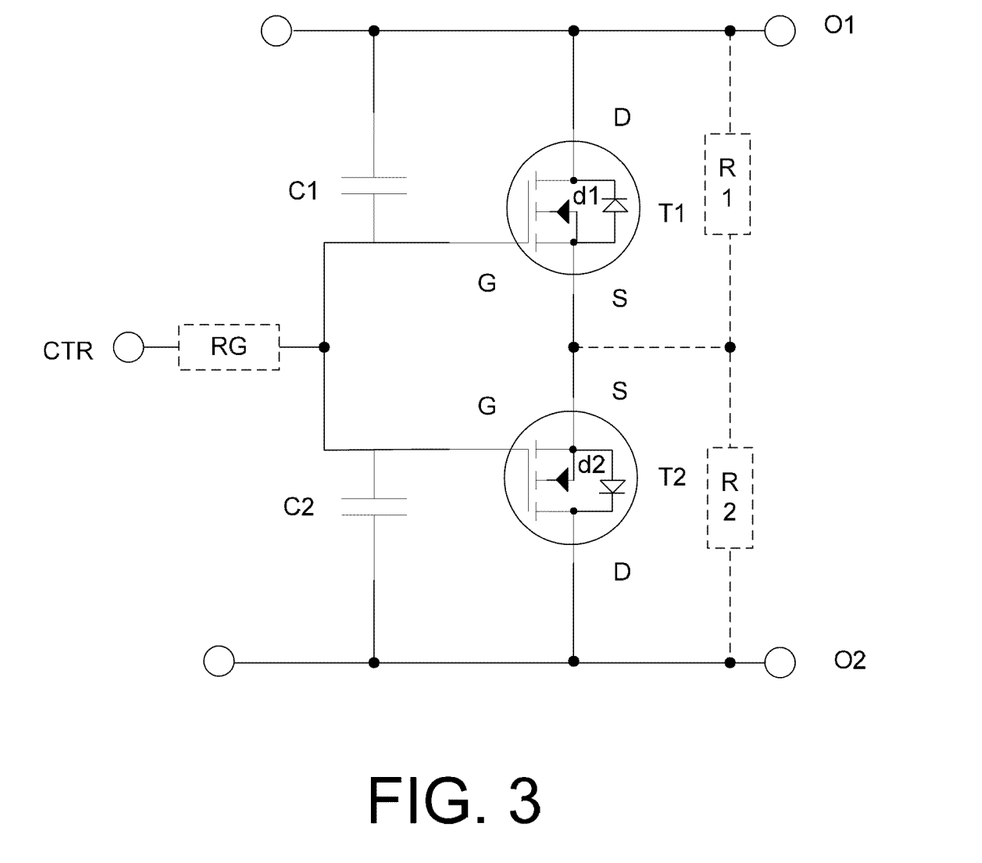
FIG. 3 shows an example of a voltage dependent resistor.

FIG. 3 shows an example of a preferred embodiment of the voltage controlled resistance RES(V). In the embodiment of FIG. 3, the voltage controlled resistance RES(V) comprises two MOS transistors T1, T2, whose source terminals (S) are electrically connected (reverse coupled).

The control input CTR of the voltage controlled resistance RES(V) is shown to be connected to the common gate (G) of the two transistors (e.g. via optional resistor RG, broviding a known input impedance in cooeperation with capacitances C1, C2). The drain terminals (D) of the two transistors T1, T2 are connected to the output terminals $O_1$, $O_2$, respectively, of the processor circuit CC. In practice, the voltage controlled resistance RES(V) may comprise various other electronic components (e.g. bipolar transistors) to implement specific levels, switching speeds, etc.

The active element in the compressor circuit comprises (or is constituted by) two anti-serially coupled MOS-FET transistors T1, T2, which by the control circuit can be driven on/off to a varying degree as variable shunt-resistors.

The control circuit comprises an audio step-up transformer (XV of FIG. 2) and a rectifying circuit (AC→DC of FIG. 1, 2), which generates a DC control signal (CTR) for the MOS-FET transistors. Simultaneously, the Gate terminal (G) of the individual MOS-FET transistors T1, T2 is AC-coupled to its own Drain terminal (D) by means of a capacitor (C1, C2, respectively, in FIG. 3). This is done to create a negative feedback AC coupling of the MOS-FET transistor, and thus to reduce distortion.

The special anti-serial coupling of the two MOS-FET transistors is used for two different reasons. One reason is to neutralise the built-in reverse diode in the individual MOS-transistor, (the diodes d1, d2 from the two transistors are in the anti-serial coupling connected anode to anode, and will thus as whole be coupled in a reverse direction), and the other reason is because the two individual MOS-transistors in this coupling act as each other's source-resistance, which has the effect that the linearity in the compression can be significantly increased, especially at high signal levels, and thus correspondingly reduce the distortion.

In the embodiment of FIG. 3, the voltage controlled resistance is implemented using two anti-serially coupled MOS-FET transistors. Alternatively the circuit can be made using a single transistor (preferably MOS-FET), which is appropriate for low impedance devices, e.g. headsets with relatively low signal levels. Further, optional resistors R1, R2 are shown in parallel over transistors T1, T2, respectively. In the non-compressing situation, the Drain to Source resistance in the two MOS-FET transistors T1 and T2 may become extremely high, in which case the common Source point of the two MOS-FET transistors would not be well-defined with respect to the Gate control-voltages for the two MOS-FET transistors. To achieve a well-defined Gate to Source voltage in this situation, two high-Ohmic resistors (R1 and R2) are connected in parallel to the two MOS-FET transistors Drain-Source way. These resistors will not influence the dynamic compressing performance of the circuit. Typical values of R1 and R2 are e.g. 10 kΩ.

In FIG. 3 the circuit is shown to be implemented with N-channel MOS-FETs. Alternatively, P-channel MOS-FETs can be used.

Figure 4A:
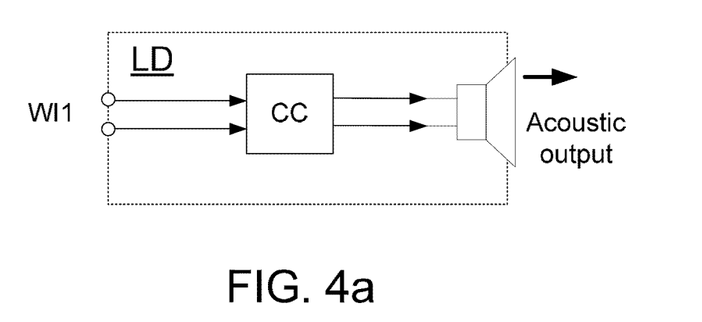
Figure 4B:
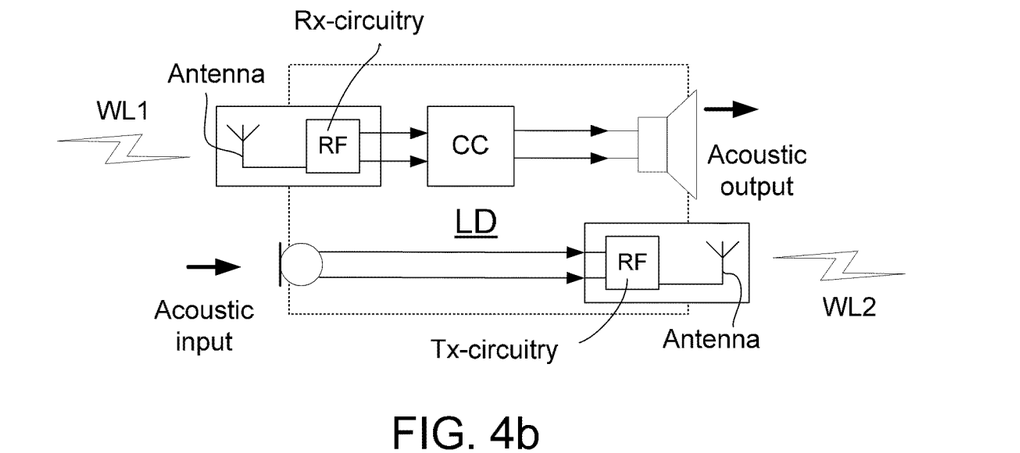

FIG. 4 shows two embodiments of a listening device comprising a compressor circuit according to the present application, FIG. 4a representing e.g. a wired ear phone application and FIG. 4b e.g. a wireless headset application. The device of FIG. 4a is a listening device LD in its simplest form (e.g. an ear phone, e.g. forming part of a headset) comprising a wired electric input WI1 for receiving an input voltage from an audio delivery device, e.g. from a handset of a telephone and connected to a compressor circuit CC as discussed in connection with FIG. 1-3, whose (possibly compressed) output voltage is connected to a speaker for presenting the audio signal to a user as an Acoustic output. FIG. 4b shows a listening device LD, e.g. a headset, comprising first and second electric signal paths. The first signal path comprises compressor circuitry CC and speaker as in FIG. 4a, but the electric input to the compressor circuit is a wireless input WL1, e.g. received from a cellular telephone or other audio delivery device. The first signal path of the listening device therefore comprises a wireless receiver comprising antenna (Antenna) and receiver (and possibly demodulation) circuitry (Rx-circuitry, RF) to extract the audio signal from the received wireless signal. The second signal path of the listening device comprises a microphone for picking up a sound from the user and/or the environment and converting the Acoustic input to an electric signal, which is connected to a transmitter comprising (possible modulation and) transmitter circuitry (Tx-circuitry, RF) and an antenna (Antenna) for wirelessly transmitting the signal WL2 to a receiving device, e.g. a telephone, a PC or another device (e.g. a communication device). Typically, the wireless input WL1 and output WL2 together constitute the bi-directional signals of a wireless link between the listening device and another device, e.g. a telephone or a basis station of a telephone system. The listening device LD of FIG. 4b can e.g. represent a wireless headset. The listening devices of FIGS. 4a and 4b may comprise other functional parts than those actually illustrated, e.g. a signal processing unit for performing additional signal processing, e.g. filtering, noise reduction, feedback reduction units, etc. Further, the listening devices may comprise a dose unit for measuring or estimating an acoustic dose accumulated over a predefined time (e.g. based on a signal picked up by a (possibly already existing) microphone. The measure or estimate of the accumulated dose may be used to control the maximum output level of the compressor circuit (cf. control signal LCT in FIG. 2). In an embodiment, the listening device (e.g. the compressor circuit) comprises a predefined relationship between an accumulated dose at a given point in time relative to a total (e.g. daily) maximum accepted dose for the time period considered and a recommended maximum output level for the remaining time of the time period in question to be able to comply with maximum dose requirements.

Figure 5A:
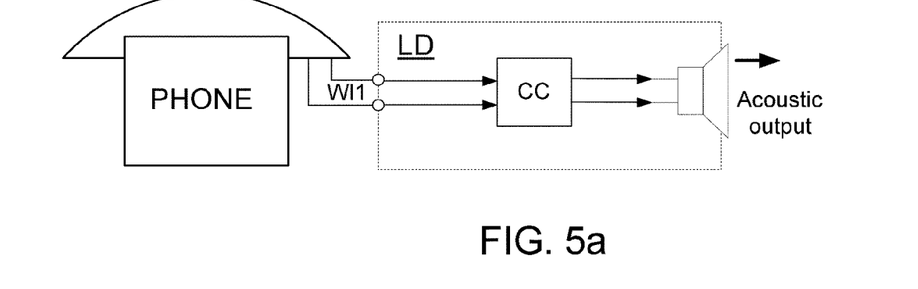
Figures 5B, 5C:
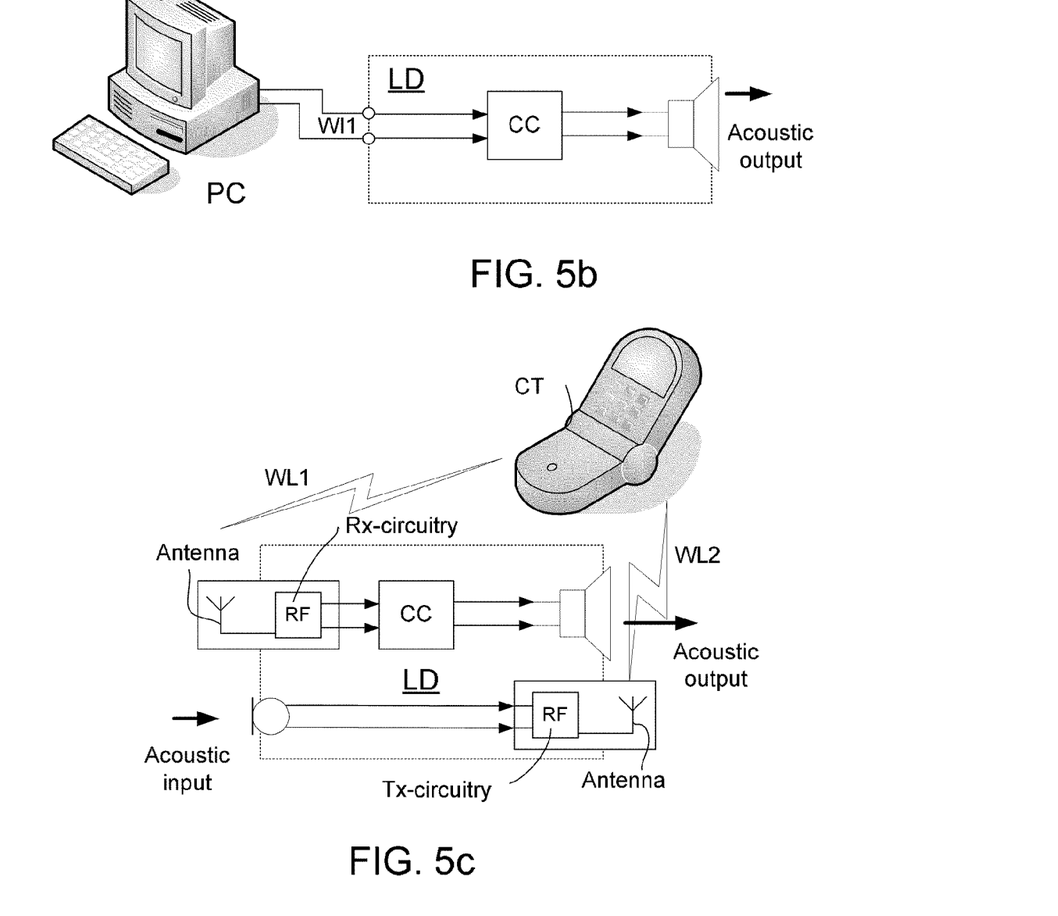

FIG. 5 shows three embodiments of a communication system comprising a compressor circuit according to the present application. FIG. 5a shows a system comprising a telephone PHONE (e.g. a fixed line telephone) and a listening device LD connected via a wired interface WI1. FIG. 5b shows a system comprising a personal computer or other computer device PC and a listening device LD connected via a wired interface WI1. The listening device LD of the embodiments of FIGS. 5a and 5b can e.g. be a listening device as shown and discussed in connection with FIG. 4a. FIG. 5c shows a system comprising a cellular telephone CT and a listening device LD connected via a wireless interface WL1, WL2. The listening device LD is e.g. a listening device as shown and discussed in connection with FIG. 4b (e.g. a headset).

Figure 6:
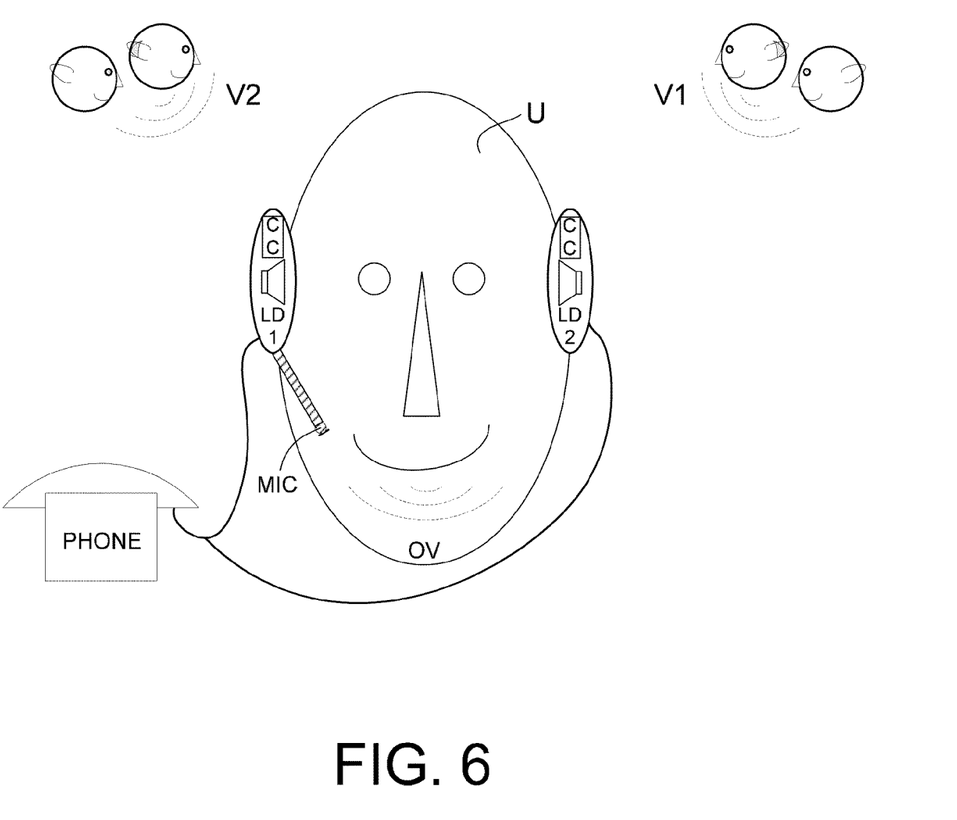
FIG. 6 shows an application scenario of a headset comprising a compressor circuit according to the present application.

FIG. 6 shows an application scenario of a listening device, e.g. a headset adapted for being worn on the head of a user U, comprising a compressor circuit CC according to the present application. The communication system shown in FIG. 6 comprises a telephone PHONE, which is electrically connected to a pair of head phones LD1, LD2 via a wired connection so that an audio signal of the telephone (instead of being presented to the user via the handset of the telephone) is presented to a user U via head phones LD1, LD2 (each comprising compressor circuitry CC and a speaker). The first (left) head phone LD1 comprises, in addition to the compressor and speaker circuitry, a microphone MC (here mounted on a longitudinal bar element) for picking up a user's U voice OV (and may be a listening device as shown and discussed in connection with FIG. 4b). The second headphone LD2 may be a listening device as shown and discussed in connection with FIG. 4a. In addition to the audio signal from the telephone (PHONE), the user's own voice OV and voices V1, V2 of other people around the user contribute to the acoustic dose exposure (together with possible other sounds, e.g. noise from surrounding equipment, etc.). Preferably, the exposure of a particular user over time is kept below a certain level. Preferably, the compressor circuitry is configured to ensure that the dose exposure over a specific predefined time is below a certain predefined level. The configuration of the compressor circuitry (e.g. the setting of the maximum output sound pressure level presented to the user via a speaker) is e.g. made with a view to the predefined noise exposure level, to the predefined time and to the type of acoustic environment the user is expected to encounter during the predefined time interval in question. In an embodiment, the maximum output level is set to a level equal to a target average level of exposure $L_{EX,T}$ plus a signal dependent x-margin $\Delta Lx$. In an embodiment, the target average level of exposure $L_{EX,T}$ is $L_{EX,8h}$=87 dBA of the EU directive 2003/10/EC for a working day. In an embodiment, where the intended use of the circuit is in an environment dominated by speech, e.g. in a call centre or in a stock exchange environment or other 'dense open office environments', the x-margin is relatively large, e.g. larger than 7 dB, such as 9 dB or larger. In a preferred embodiment, the maximum output level of the compressor circuits (CC of headphones LD1, LD2 of FIG. 6) is set to a level equal to 94 dB to comply with the target exposure of the EU directive.

Figure 7:
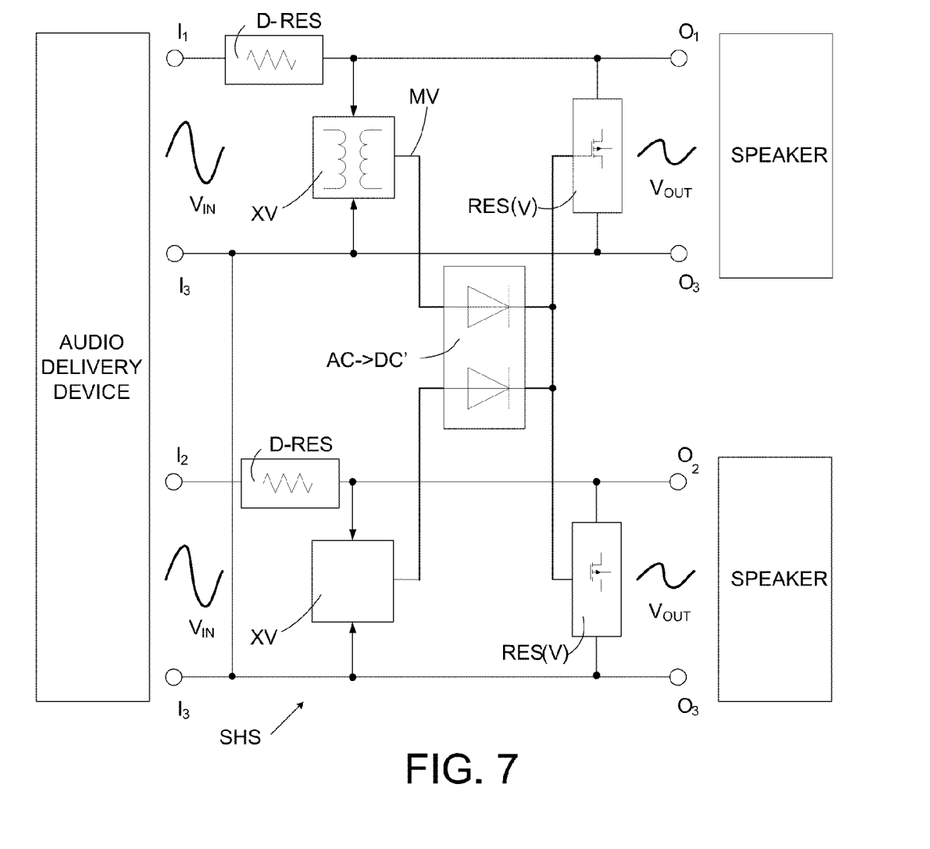
FIG. 7 shows an embodiment of a stereo headset comprising first and second listening devices, each comprising a compressor circuit connected to an earphone.

FIG. 7 shows an embodiment of a stereo headset SHS (or a pair of stereo headphones) comprising first and second listening devices, each comprising a compressor circuit connected to an earphone (speaker). The microphone of the stereo headset is not shown (FIG. 7 may alternatively illustrate a pair of stereo headphones). The stereo headset SHS may e.g. be embodied as shown in FIG. 6. The first and second listening devices of the stereo headset SHS may e.g. comprise listening devices as shown and discussed in connection with FIG. 4 and comprising compressor circuits as shown and discussed in connection with FIGS. 1 and 2 (here embodiments as shown in FIGS. 4a and 2b are used). In the stereo headset shown in FIG. 7, a speaker unit is adapted to be located at each ear of a user. Each speaker unit is connected to a compressor circuit as described above, and circuitry (AC→DC') adapted to control the compressor circuits to provide that the output levels of the respective speakers are correlated, so that a specific compression in the speaker unit at one ear results in a corresponding compression in the speaker unit at the other ear. One of the I/O-terminals of the compressor circuit of the first listening device is common with the corresponding I/O-terminal of the compressor circuit of the second listening device (cf. $I_3/O_3$). The stereo headset (or stereo headphones) may be adapted to limit the output (of any of the speakers of the system) to a predefined maximum sound pressure level.

Figure 9A:
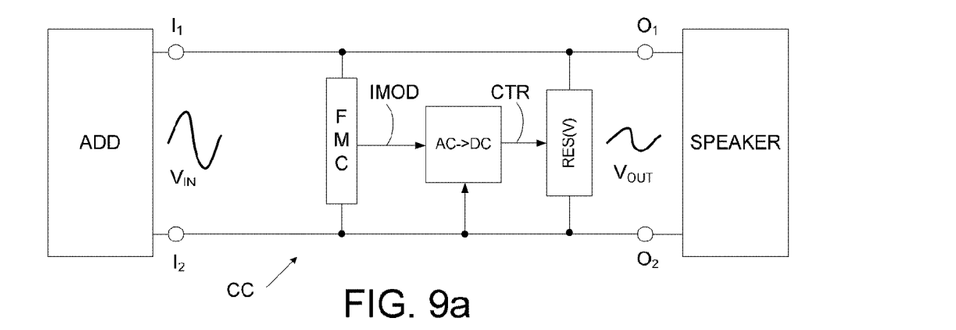
FIG. 9 shows an embodiment of a compressor circuit according to the present application wherein the degree of compression varies with frequency.
Figure 9B:
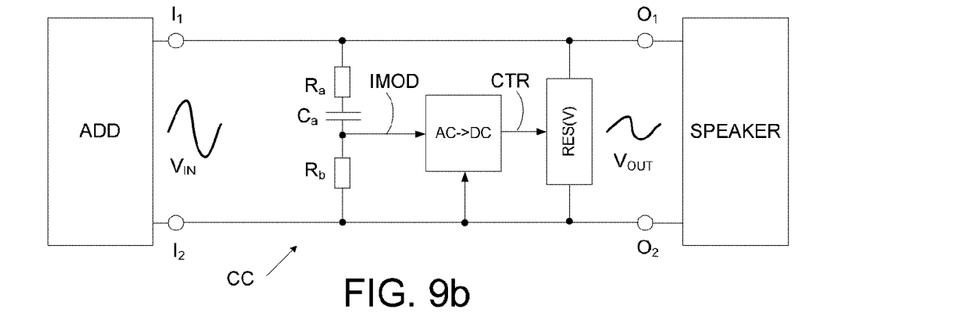

FIG. 9 shows an embodiment of a compressor circuit CC according to the present application wherein the degree of compression varies with frequency. FIG. 9a is a modification of the basic embodiment of a compressor circuit shown in FIG. 1. In addition to the components of FIG. 1, the compressor circuit CC of FIG. 9a comprises a component or circuit FMC for modifying frequency components of the input signal $I_1$, $I_2$ (input voltage $V_{IN}$). The purpose of component FMC is to provide that the output limiting voltage $V_{OUT}$ from the compressor circuit CC is varying with the audio frequency. The circuit FMC may alternatively be located in other parts of the control path, e.g. in the embodiments of FIG. 2 in the signal path MV between the AC voltage control unit XV and the AC to DC voltage converter AC→DC. The circuit FMC for modifying frequency components of the input signal may e.g. be a passive network, e.g. comprising any combination of resistors, inductors and/or capacitors. In the embodiment of a compressor circuit CC shown in FIG. 9b, the circuit FMC comprises a combination of resistors Ra, Rb and capacitors Cα, and provides output signal IMOD connected to the AC to DC voltage converter AC→DC.

The invention is defined by the features of the independent claim(s). Preferred embodiments are defined in the dependent claims. Any reference numerals in the claims are intended to be non-limiting for their scope.

Some preferred embodiments have been shown in the foregoing, but it should be stressed that the invention is not limited to these, but may be embodied in other ways within the subject-matter defined in the following claims.

REFERENCES

WO 03/079722 A1 (SENNHEISER COMMUNICATIONS) 25 Sep. 2003
[ACIF G616:2006] "INDUSTRY GUIDELINE, ACIF G616: 2006, ACOUSTIC SAFETY FOR TELEPHONE EQUIPMENT", published by the Australian Industry Communications Forum, $2^{nd}$ edition 2006 (www.acif.org.au).

The invention claimed is:

1. A compressor circuit for a listening device, the compressor circuit comprising:
a pair of input terminals; and
a pair of output terminals, wherein
the compressor circuit is configured
to receive an electric input signal representing an audio signal with an input voltage swing $V_{ipp}$ at the input terminals and
to provide a possibly compressed version of the input signal as an output signal with an output voltage swing $V_{opp}$ at the output terminals, and
the compressor circuit further comprises
an AC to DC voltage converter for generating a DC-control voltage based on the electric input signal or an AC signal derived therefrom; and
a voltage controlled resistance for providing the output voltage swing $V_{opp}$ controlled by the DC-control voltage,
wherein the compressor circuit is energized by the electric input signal, and
wherein the voltage controlled resistance comprises a first FET transistor and a second FET transistor, each FET transistor including a source terminal, a gate terminal, and a drain terminal, and
wherein the source terminal of the first FET transistor is directly electrically connected in series to the source terminal of the second FET transistor.

2. The compressor circuit according to claim 1, further comprising:
a drop resistance for providing a minimum input resistance of the compressor circuit.

3. The compressor circuit according to claim 1, further comprising:
an AC voltage control unit for controlling voltage level of the electric input signal.

4. The compressor circuit according to claim 3, wherein
the AC voltage control unit provides a predefined multiplication factor M, and
the output voltage from the AC voltage control unit is a factor M times the input voltage to the AC voltage control unit.

5. The compressor circuit according to claim 4, wherein
the multiplication factor M is set between a maximum and a minimum value in predefined steps.

6. The compressor circuit according to claim 3, wherein the AC voltage control unit comprises a transformer.

7. The compressor circuit according to claim 3, wherein the AC voltage control unit comprises a diode circuit.

8. The compressor circuit according to claim 1, wherein the AC to DC voltage converter comprises a diode circuit.

9. The compressor circuit according to claim 1, wherein
the gate terminal of the first FET transistor is AC coupled to the drain terminal of the first FET transistor, and
the gate terminal of the second FET transistor is AC coupled to the drain terminal of the second FET transistor.

10. The compressor circuit according to claim 1, wherein the output voltage swing $V_{opp}$ from the compressor circuit is varying with a frequency of the audio signal represented by the electric input signal in a predetermined manner.

11. The compressor circuit according to claim 10, further comprising:
a passive modification circuit including a combination of resistors and capacitors and/or inductors in the control path, the control path including the circuitry for generating the DC-control voltage for controlling the voltage controlled resistance.

12. A listening device comprising a compressor circuit according to claim 1 and a speaker unit electrically connected to the compressor circuit.

13. A listening device according to claim 12 adapted to limit the output of the speaker unit to a predefined maximum sound pressure level.

14. A stereo headset comprising first and second listening devices according to claim 12.

15. A stereo headset according to claim 14 adapted to receive separate audio signals from an audio delivery device to said first and second listening devices.

16. A stereo headset according to claim 15 comprising circuitry adapted to provide that the output levels in the respective earphones controlled by the respective compressor circuits of the first and second listening devices are correlated, so that a specific compression in one of the earphones results in a corresponding compression at the other earphone.

17. A stereo headset according to claim 16 adapted to provide that the earphone presently experiencing the highest level determines the output level of both earphones.

18. A stereo headset according to claim 14 adapted to limit the output of any of the speakers of the system to a predefined maximum sound pressure level.

19. The compressor circuit according to claim 1, wherein
the gate terminal of the first FET transistor is directly electrically connected to the gate terminal of the second FET transistor.

20. The compressor circuit according to claim 19, wherein
the drain electrode of the first FET transistor is directly electrically connected to a first output terminal of the pair of output terminals, the drain electrode of the second FET transistor is directly electrically connected to a second output terminal of the pair of output terminals, the source terminal of the first FET transistor is not directly electrically connected to either of the pair of output terminals, and the source terminal of the second FET transistor is not directly electrically connected to either of the pair of output terminals.

\* \* \* \* \*